United States Patent
Lynch et al.

(10) Patent No.: US 7,085,121 B2
(45) Date of Patent: Aug. 1, 2006

(54) VARIABLE CAPACITANCE MEMBRANE ACTUATOR FOR WIDE BAND TUNING OF MICROSTRIP RESONATORS AND FILTERS

(75) Inventors: Jonathan J. Lynch, Oxnard, CA (US); Sarabjit Mehta, Calabasas, CA (US); John Pasiecznik, Malibu, CA (US); Peter Petre, Oak Park, CA (US)

(73) Assignee: HRL Laboratories, LLC, Malibu, CA (US)

(*) Notice: Subject to any disclaimer, the term of this patent is extended or adjusted under 35 U.S.C. 154(b) by 188 days.

(21) Appl. No.: 10/421,302

(22) Filed: Apr. 22, 2003

(65) Prior Publication Data

US 2004/0075967 A1 Apr. 22, 2004

Related U.S. Application Data

(60) Provisional application No. 60/420,176, filed on Oct. 21, 2002.

(51) Int. Cl.
 *H01G 7/00* (2006.01)

(52) U.S. Cl. ............... 361/277; 361/272; 361/278; 361/279; 361/282; 361/283.1; 361/292

(58) Field of Classification Search ............... 361/272, 361/277, 278, 279, 280, 282, 287, 290, 292, 361/298.2, 273, 281
See application file for complete search history.

(56) References Cited

U.S. PATENT DOCUMENTS

| | | | | |
|---|---|---|---|---|
| 3,646,413 | A | 2/1972 | Oomen | 317/246 |
| 4,099,211 | A | 7/1978 | Hathaway | 360/109 |
| 4,237,399 | A | 12/1980 | Sakamoto | 310/317 |

(Continued)

FOREIGN PATENT DOCUMENTS

| | | |
|---|---|---|
| JP | 2002-170470 | 6/2002 |
| WO | 89/07345 | 8/1989 |
| WO | 01/13457 A1 | 2/2001 |
| WO | 02/45181 A1 | 6/2002 |

OTHER PUBLICATIONS

Barker, N.S., et al., "Distributed MEMS True–Time Delay Phase Shifters and Wide–Band Switches," *IEEE Transactions on Microwave Theory and Techniques*, vol. 46, No. 11, pp 1881–1890 (Nov. 1998).

Hung, E.S., et al., "Extending the Travel Range of Analog–Tuned Electrostatic Actuators," *Journal of Microelectromechanical Systems*, vol. 8, No. 4, pp 497–505 (Dec. 1999).

Kondo, S., et al., "Precise Control of Small Displacements of a Stacked Piezoelectric Actuator by Means of Layer–By–Layer Driving," *Micro Electro Mechanical Systems, 14th IEEE International Conference*, pp 248–251 (2001).

Park, J.Y., et al., "Micromachined RF Mems Tunable Capacitors Using Piezoelectric Actuators," *IEEE MTT–S Digest*, pp 2111–2114 (2001).

Percin, G., et al., "Micromachined 2–D Array Piezoelectrically Actuated Flextensional Transducers," *1997 IEEE Ultrasonics Symposium*, pp 959–962 (1997).

(Continued)

*Primary Examiner*—Dean A. Reichard
*Assistant Examiner*—Nguyen T. Ha
(74) *Attorney, Agent, or Firm*—Ladas & Parry LLP

(57) ABSTRACT

A device for varying the capacitance of an electronic circuit is disclosed. The device comprises a flexible membrane located above the electronic circuit, a metal layer connected to the flexible membrane, and bias circuitry located above the membrane. Variation of the capacitance of the electronic circuit is obtained by pulling the membrane upwards by means of the bias circuitry. The disclosed device provides a sizeable capacitance variation and high Q factor, resulting in overall low filter insertion loss. A nearly constant group delay over a wide operating bandwidth is also obtained.

18 Claims, 7 Drawing Sheets

U.S. PATENT DOCUMENTS

| | | | |
|---|---|---|---|
| 4,468,644 A | 8/1984 | Teague et al. | 333/205 |
| 4,716,331 A | 12/1987 | Higgins, Jr. | 310/330 |
| 4,916,349 A | 4/1990 | Kornrumpf | 310/332 |
| RE33,568 E | 4/1991 | Harnden, Jr. et al. | 310/332 |
| 5,089,740 A | 2/1992 | Ono | 310/328 |
| 5,093,600 A | 3/1992 | Kohl | 310/332 |
| 5,406,233 A | 4/1995 | Shih et al. | 333/161 |
| 5,548,313 A | 8/1996 | Lee | 347/68 |
| 5,870,007 A | 2/1999 | Carr et al. | 333/262 |
| 5,877,123 A | 3/1999 | Das | 505/210 |
| 5,990,766 A | 11/1999 | Zhang et al. | 333/205 |
| 5,994,821 A | 11/1999 | Imada et al. | 310/332 |
| 6,127,908 A | 10/2000 | Bozler et al. | 333/246 |
| 6,212,056 B1 | 4/2001 | Gammel et al. | 361/277 |
| 6,215,644 B1 | 4/2001 | Dhuler | 361/380 |
| 6,377,438 B1 | 4/2002 | Deane et al. | 361/278 |
| 6,404,304 B1 | 6/2002 | Kwon et al. | 333/202 |
| 6,479,920 B1 | 11/2002 | Lal et al. | 310/309 |
| 6,662,029 B1 | 12/2003 | Eden et al. | 505/210 |
| 2002/0050882 A1 | 5/2002 | Hyman et al. | 335/78 |
| 2002/0109436 A1 | 8/2002 | Peng et al. | 310/328 |

OTHER PUBLICATIONS

Yamaguchi, M., et al., "Distributed Electrostatic Micro Actuator," *Proc. IEEE Conf. On Micro Electro Mechanical Syst.*, Fort Lauderdale, FL, pp 18–23 (Feb. 7–10, 1993).

Dec, A., et al., "Micromachined Varactor With Wide Tuning Range," *Electronic Letters*, vol. 33, No. 11, pp. 922–924 (May 22, 1997).

Li, M., et al., "New Tunable Phase Shifters Using Perturbed Dielectric Image Lines," *IEEE Transactions on Microwave Theory and Techniques*, vol. 46, No. 9, pp. 1314–1317 (Sep. 1998).

Yun, T., "Analysis and Optimization of a Phase Shifter Controlled by a Piezoelectric Transducer," *IEEE Transactions on Microwave Theory and Techniques*, vol. 50, No. 1, pp. 105–111 (Jan. 2002).

VARIABLE CAPACITANCE MEMBRANE ACTUATOR FOR WIDE BAND TUNING OF MICROSTRIP RESONATORS AND FILTERS

CLAIM OF BENEFIT OF PROVISIONAL APPLICATION

This application claims the benefit of U.S. provisional application Ser. No. 60/420,176 filed on Oct. 21, 2002, which is incorporated herein by reference in its entirety.

CROSS-REFERENCE TO RELATED APPLICATIONS

The present document is related to the copending and commonly assigned patent application documents entitled "Piezoelectric Switch for Tunable Electronic Components," Ser. No. 10/421,327 and "Piezoelectric Actuator for Tunable Electronic Components," Ser. No. 10/421,303, which are all filed of even date herewith. The contents of these related applications are hereby incorporated by reference herein.

FIELD OF THE INVENTION

The present invention relates to membrane actuators for tuning of resonators and to a method of fabricating a membrane actuator. More specifically, it relates to a variable capacitance membrane actuator for wide band tuning of resonators and filters.

BACKGROUND OF THE INVENTION

In the last years, the need for highly accurate, quick, reliable filter-tuning techniques has become acute. A field of high interest is represented by high performance resonators and filters, especially medium-to-high power miniature filters with wide tunable bandwidth. These kind of devices need to have very small dimensions, in order to fit inside high-performance planar filters, such as micromachined stripline and High Temperature Superconductor (HTS) multi-pole filters.

Micromachining is a term commonly used to describe chemical etch processes that selectively remove certain materials in certain places, as opposed to standard machining techniques that mechanically remove material. Due to the very tight tolerances that can be maintained in a chemical etch, very small and highly accurate features can be produced, hence the term "micro" machining. In addition, many substrates that are commonly used in electronic circuit applications (eg silicon, glass) are not easily machined using standard techniques due to the possibility of material fracture.

Devices of this kind that are appropriate for tunable filters and phase shifters are microelectromechanical (MEM) capacitors and capacitive MEM switches. However, variable capacitors thus fabricated that rely on electrostatic actuation are capable of only a 33% capacitance change due to the so called "snap down" phenomenon, as better explained in the following. The continuous tunability of these devices in resonator/filter center frequency is less than 10%.

Other filter-tuning approaches are known, such as bulk ferroelectric materials, varactor diodes, and Barium Strontium Titanate (BST) thin films. See for example U.S. Pat. No. 5,990,766 (bulk ferroelectric tuning), U.S. Pat. No. 4,468,644 (varactor diode tuning) and U.S. Pat. No. 5,877,123 (thin film tuning). However, also these devices have disadvantages, principally due to a low third-order intercept point (IP3) and to high insertion loss. The disadvantage with tunable filters having a low IP3 is that they have very limited power-handling capability, so that they are not usable for example, in radar systems as preselectors. Further, another disadvantage of bandpass filters with high insertion loss is that they do not have a narrow bandwidth. In addition, bulk ferroelectric material requires high applied voltage to tune the device, and is expensive.

SUMMARY OF THE INVENTION

According to the present invention, a micromachined variable capacitance membrane actuator (VCMA) for wide band tuning of resonators and filters is disclosed, preferably fabricated using a wafer-level packaging technique.

According to a first aspect, the present invention discloses a device for tuning an electronic circuit, comprising: a moveable membrane, wherein changes in distance between the membrane and the electronic circuit produce changes in capacitance of the electronic circuit; and a first capacitive arrangement operatively associated with the membrane, comprising a first capacitor plate and a second capacitor plate, wherein the first capacitor plate is located at a first distance from the electronic circuit and connected with the membrane, and the second capacitor plate is located at a second distance from the electronic circuit, the second distance being greater than the first distance.

According to a second aspect, the present invention discloses an actuator for varying a capacitance of an electronic circuit, comprising: a moveable membrane, wherein movement of the membrane varies the capacitance of the electronic circuit; and a rod connected with the membrane, wherein: the movement of the membrane is obtained by varying the distance of the rod from the electric circuit; the membrane has a static condition and a dynamic condition; and a distance between the membrane and the electronic circuit during the dynamic condition of the membrane can either be greater or shorter than a distance between the membrane and the electronic circuit during static condition of the membrane.

According to a third aspect, the present invention discloses a membrane actuator for tuning an electronic circuit, comprising: a first substrate; a first conductive material disposed on the first substrate and containing the electronic circuit, the first substrate and the first conductive material forming a first layer; a deformable membrane; a second conductive material connected with the flexible membrane, the flexible membrane and the second conductive material forming a second layer, the flexible membrane and the second conductive material being located at a distance from the first substrate and the first conductive material; a second substrate; a third conductive material connected with the second substrate, the second substrate and third conductive material forming a third layer; and a magnetic element attached to the membrane, wherein, upon application of a bias voltage to the magnetic element, a magnetic force is produced, causing the membrane to deform, thereby varying the distance of the second conductive material from the electronic circuit and tuning the electronic circuit.

According to a fourth aspect, the present invention discloses a membrane actuator for tuning an electronic circuit, comprising: a first substrate; a first conductive material disposed on the first substrate and containing the electronic circuit, the first substrate and the first conductive material forming a first layer; a flexible membrane; a second conductive material contacting the flexible membrane, the flexible membrane and the second conductive material forming a second layer, the flexible membrane and second conductive material being disposed above the first substrate and first pattern; a second substrate; a third conductive material contacting the second substrate, the second substrate and third conductive material forming a third layer, wherein: a parallel plate capacitor having an upper plate and a lower plate is formed between the second layer and the third layer, the second conductive material forming the upper plate of the capacitor and the third conductive material forming the lower plate of the capacitor, and when a bias voltage is applied between the upper plate and the lower plate, an electrostatic force is produced, causing the membrane to deform, thereby varying the capacitance of the electronic circuit.

According to a fifth aspect, the present invention discloses an actuator for tuning an electronic circuit, comprising: a first substrate; a first cavity located in the first substrate; a first electrically conductive arrangement disposed in the first cavity, the first electrically conductive arrangement comprising the electronic circuit; a second substrate; a second cavity located in the second substrate; a second electrically conductive arrangement disposed in the second cavity; a flexible membrane located between the first substrate and the second substrate; and a third electrically conductive arrangement contacting the flexible membrane, wherein tuning of the electronic circuit is obtained by movement of the flexible membrane.

According to a sixth aspect, the present invention relates to a method for fabricating a membrane, comprising the steps of: providing a substrate; depositing a first metal layer on the substrate; patterning the first metal layer to form a first metal pad; depositing a membrane layer on the substrate and the first metal pad; curing the membrane layer; depositing a second metal layer on the cured membrane layer; depositing a photoresist layer on the second metal layer; patterning the photoresist layer to form a photoresist pad; patterning the second metal layer to form a second metal pad; removing the first metal pad; and removing the photoresist pad.

According to a seventh aspect, the present invention relates to a membrane fabrication method comprising the steps of: providing a substrate having a first side and a second side; depositing a first protective layer on the first side; depositing a second protective layer on the second side; depositing a first metal layer on the first protective layer; patterning the first metal layer to form a first metal pad; patterning the second protective layer to form etch windows; forming a membrane layer on the substrate and the first metal pad; curing the membrane layer; depositing a second metal layer on the cured membrane layer; forming a photoresist layer on the second metal layer; patterning the photoresist layer to form a photoresist pad; removing a portion of the substrate through the etch windows of the second protective layer; patterning the second metal layer to form a second metal pad; removing the first metal pad; and removing the photoresist pad.

The VCMA can comprise a plurality of electrostatically controlled, flexible membranes that are patterned and metallized onto a substrate or wafer. The wafer is bonded directly above a circuit substrate comprising a plurality of phase shifter circuits. The circuit substrate can be for example a high resistivity silicon or alumina substrate, or a High Temperature Superconductor (HTS) substrate, such as LaAlO$_3$ or MgO.

A first advantage of the present invention is that the achievable capacitance range of the VCMA/wafer-level packaging approach adopted to fabricate the VCMA according to the present invention is much more than that of any other membrane-type tuning approach, such as the microelectromechanical system (MEMS) capacitor, or the capacitive MEMS switch. More specifically, the VCMA according to the present invention provides a sizeable capacitance variation and high Q factor, resulting in overall low filter insertion loss even for extremely narrowband bandpass filters. By contrast with the maximum capacitance change of those devices, the combined VCMA/wafer-level packaging approach according to the present invention can provide a much wider range of capacitance variation.

The wider capacitance tuning range of the device according to the present invention is achieved by electrostatically actuating the membrane from above the circuit. All uses of capacitive membranes to date have actuated the membrane by electrostatically actuating the membrane from the circuit positioned below the membrane. In prior art embodiments, the actuating circuit is the same circuit that is used to carry the RF signals. This fact complicates the RF design by requiring the RF circuitry to also carry the DC membrane bias circuitry. In addition, pulling down on the membrane electrostatically creates a change in DC capacitance that, in turn, further increases the force. The result is that the membrane can be moved only for a partial distance of the total distance between the membrane and the bias circuit before the membrane becomes unstable and snaps down to the bias circuitry, thus eliminating the capacitive gap. Due to this instability, the membrane travel is limited to only 33% of the total gap. Thus the maximum capacitance change is limited to one third of the gap between the membrane and the bias circuitry. The additional presence of the RF circuitry requires the gap to be very small, so that only a limited capacitance change can be obtained.

During the present application, the term "DC" is used to describe very low frequency signals. Any signal, DC or AC, could be applied to the membrane, however the membrane response is limited to low frequencies since a mechanical response is involved. The term DC used here is consistent with established practice, although it is understood to include low frequency variations.

The present invention significantly extends the capacitance range by pulling the membrane upward from bias circuitry located above the membrane. Since this circuitry carries no RF signals, the gap between the membrane and the bias circuit can be made larger than the gap between the membrane and the RF circuitry. Thus a 33% change in the membrane position at the upper gap can result in a very large percentage change in the RF gap. In this way very large capacitance changes can be realized, in the range of 40–60%.

Further advantages of the present invention are that the tunable filters thus obtained can be built with high IP3, low insertion loss, extremely narrow bandwidth, large out-of-band rejection, steep filter skirts, high power-handling capability and high reliability. Moreover, the wafer-level packaging approach according to the present invention offers a solution for many of the problems associated with the prior art micromachining/packaging techniques and ensures good uniformity and reproducibility of the tunable resonators and filters.

A preferred way to achieve small and precise gaps, both RF and DC, is to fabricate the structure using modern semiconductor processing techniques such as wafer level packaging techniques and micromachining. Wafer level packaging allows very small structures to be made, and multiple structures to be mated together with very high precision spacings, on the order of few microns. As a result, very tight tolerances can be held and the resulting structures have the potential for good uniformity and reproducibility. The ability to hold tight tolerances of the metal etch patterns and membrane/circuit separation is important in reproducing the variable RF capacitances. Micromachining is used to create openings in the substrate materials where the flexible membrane is located. This wafer level packaging approach also allows many devices to be made simultaneously, thus reducing the cost of each device.

The VCMA according to the present invention will provide a continuous tunability of +/−20–30% in resonator/filter center frequency (corresponding to a capacitance change of roughly 40–60%), which is beyond today's state-of-the-art, which is less than 10% tunability. Moreover, both resonator/filter center frequency and bandwidth can be independently controlled, by using VCMAs to tune the resonant frequencies of the resonators, as well as to change the amount of coupling between the resonators.

According to the present invention, continuously tunable phase shifters can be obtained, to be used in an Electronically Scanning Antenna (ESA) or other applications that require a high performance phase shifter. Moreover, also X-band front-end selectable filter banks, advanced multi-function RF systems, UHF communication radars, commercial and military SATCOM terminals, and wireless base stations are areas of great interest for the present invention.

The VCMA according to the present invention will provide continuous tunability of any desired value (depending on the circuit construction) and also provide nearly constant group delay over a wide operating bandwidth. This latter characteristic is essential for wideband ESA operation.

BRIEF DESCRIPTION OF THE DRAWINGS

The present invention will be understood and appreciated more fully from the following detailed description taken in conjunction with the drawings in which.

DETAILED DESCRIPTION OF THE INVENTION

Figure 1:
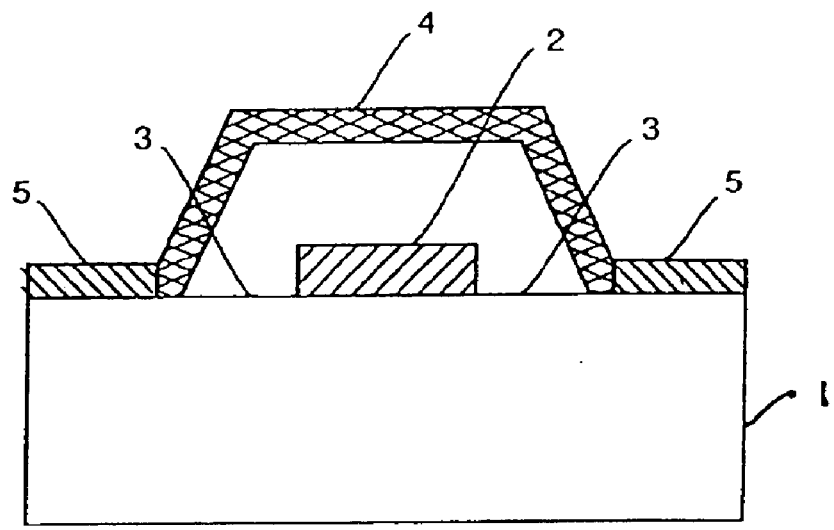
FIG. 1 shows a schematic view of a prior art variable capacitance membrane actuator.

FIG. 1 shows a prior art arrangement of a VCMA, as also shown in N. S. Barker and G. M. Rebeiz, "Distributed MEMS true-time delay phase shifters and wideband switches," IEEE Trans. Microwave Theory Tech., Vol. 46, pp. 1881–1890, November 1998. More specifically, FIG. 1 shows a cross section of a quartz substrate 1 that contains a coplanar waveguide transmission line, having a center conductor 2 and ground plane gaps 3. A gold bridge 4 is fabricated over the center conductor 2, connected to a ground metal 5. As a voltage difference is applied between the center conductor 2 and the ground, the bridge 4 is attracted electrostatically to the center conductor 2, thus deforming the bridge 4. The result is a capacitance increase between the center conductor 2 and ground. The variation of the capacitance can be controlled by controlling the applied voltage difference.

Figure 2A:
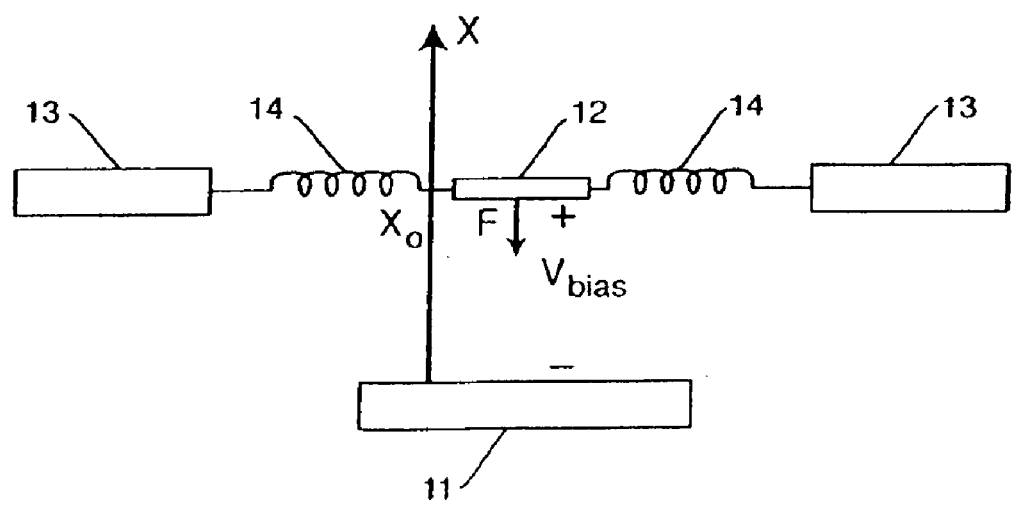
FIGS. 2A and 2B show a mathematical model corresponding to the prior art arrangement of FIG. 1.
Figure 2B:
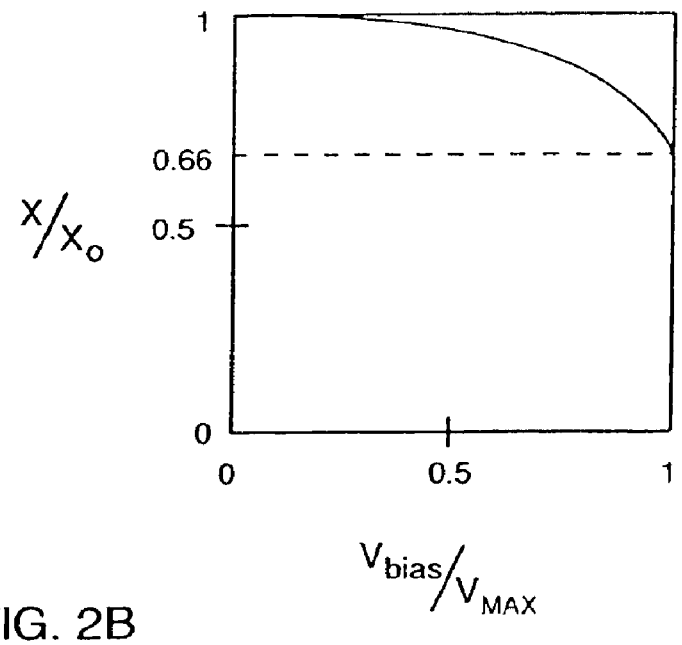

FIGS. 2A and 2B show a mathematical model corresponding to the arrangement of FIG. 1. According to this model, the VCMA arrangement can be modelled as a parallel plate capacitor "on a spring", that is with the top plate of the capacitor attached to a spring, as shown in FIG. 2A.

With reference to the model of FIG. 2A, the substrate containing the RF circuitry (for example a phase shifter) is indicated by numeral 11. The metallized membrane or gold bridge is indicated at 12. The membrane 12 can be imagined to be connected to supports 13 through springs 14. The zero bias position of the membrane 12 along the x vertical axis shown in the figure is indicated with $x_0$. As soon as a bias voltage $V_{bias}$ is applied between the membrane 12 and the substrate 11, an electrostatic force F moves the membrane 12 downwards. Movement of the membrane 12 causes RF capacitance changes in the bottom circuit that will tune the resonant frequency of individual resonators and the coupling coefficients between resonators.

The relationship between the position of the membrane 12 on the x axis and the applied $V_{bias}$ voltage is shown in FIG. 2B. From that Figure it can be seen that in absence of applied voltage the position of the membrane 12 is $x_0$ (i.e. $x/x_0=1$). As soon as the applied voltage $V_{bias}$ raises, the membrane 12 moves toward the substrate 11. However, when the bias voltage reaches a value $V_{max}$ (i.e. $V_{bias}/V_{max}=1$), the membrane 12 (upper plate of the capacitor) snaps down, shorting out the lower plate of the capacitor (RF substrate 11). This snapping occurs at a position $x=2/3x_0$ (i.e. $x/x_0=0.66$). Thus the plate spacing cannot be reduced below this value without the plates shorting out. This means that the capacitance tuning range is limited to the value of 33%, as already pointed out in the introductory part of the present application.

Figure 3:
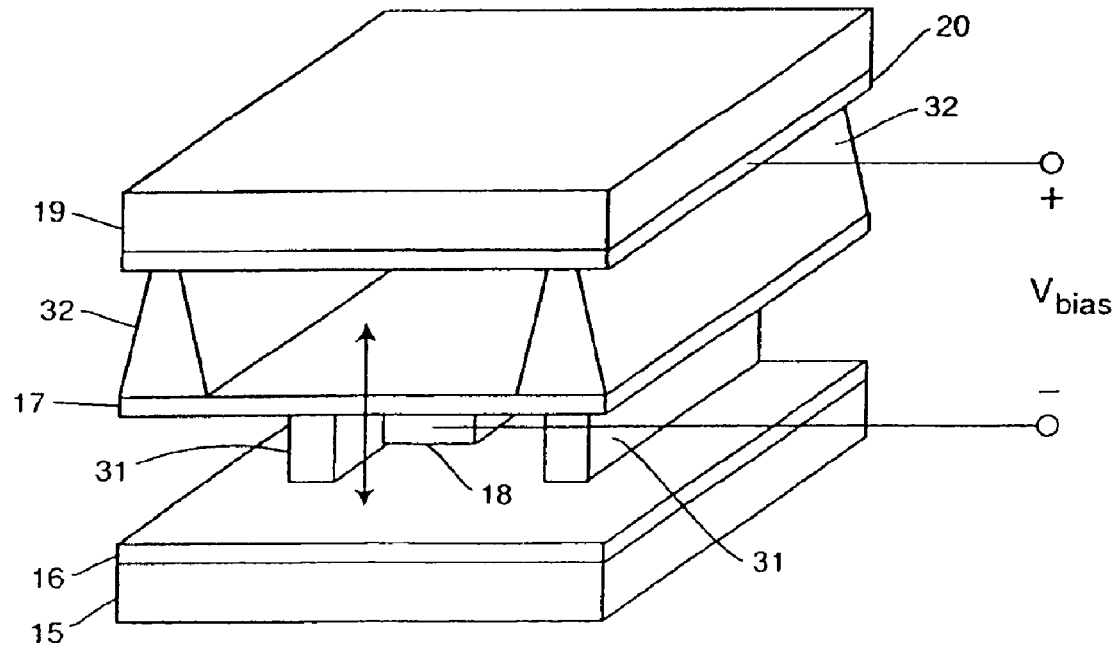
FIG. 3 shows a schematic perspective view of the variable capacitance membrane actuator according to the present invention.

FIG. 3 shows a schematic perspective view of the variable capacitance membrane actuator according to the present invention. A first substrate or wafer 15 (for example a micromachined wafer) is shown, on which a pattern 16 of conductive material, preferably gold, is disposed. On this pattern 16 the electronic circuit whose capacitance has to be tuned, for example a phase shifter, is formed. Such circuit is not shown in FIG. 3, for clarity purposes. The first wafer 15 and the pattern 16 form a first layer of the structure according to the present invention. A second layer of the structure according to the present invention comprises a flexible membrane 17 and a pattern 18 of conductive material, preferably gold, disposed under the flexible membrane 17. The second layer is placed above the first layer. The first and second layer are separated through precision spacers 31. The precision spacers 31 are formed by depositing a uniform layer of an insulator (for example polymide) or metal of a specified thickness. This polymide or metal is then selectively etched, using standard photolithographic techniques, to form precise spacers of any desired shape. As a consequence, the second layer is bonded to the first layer, with the spacers 31 keeping a precise distance between the two layers.

A third layer of the structure according to the present invention comprises a second substrate or wafer 19 and a pattern 20 of conductive material, for example gold, disposed under the wafer 19. The third layer is placed above the second layer. The second and third layer are separated through a micromachined portion of a third wafer 32. Alternatively, polymide spacers like the spacers 31 can be used to separate the second layer from the third layer. Preferably, polymide spacers are used when the gap between the second and third layer is small (<25 μm), while micromachined portions of a wafer are used as spacers when the gap is large (>25 μm).

The flexible membrane 17 may be defined using photolithography techniques. In particular, the wafer 32 is coated with a film of suitable material (for example polymide) of specific thickness, which is then patterned with a conductive material (for example gold). The wafer is then selectively etched away, leaving the polymide intact. Thus, flexible, conductive membranes are formed in the places where the substrate has been removed. In the device according to the present invention, micromachining is preferred in order to produce small membranes in silicon or glass while maintaining very tight tolerances.

In this way a parallel plate capacitor is formed between the second and third layer. The conductive layer 18 under the flexible membrane 17 forms the lower plate of the capacitor, while the conductive layer 20 under the second wafer 19 forms the upper plate of the capacitor. This parallel plate capacitor is separate from the capacitor formed between the first and second layer. Applying a DC bias voltage $V_{bias}$ between the plates 18 and 20 of the upper capacitor produces an upward electrostatic force on the membrane 17 and causes the membrane 17 to deform, thus forming the variable capacitance membrane actuator. The movement of the membrane 17 causes RF capacitance changes in the bottom RF circuit. These changes will tune the resonant frequency of individual resonators and the coupling coefficients between resonators. The value of the capacitance depends on the distance between the metal layers 18 and 20, and increases as the distance is reduced. Thus, moving the membrane changes the distance between the metal layers 18 and 20, and the capacitance varies as a result.

In prior art embodiments, the circuit to be tuned is placed at the same level with the lower plate of the capacitor, as shown in FIGS. 1 and 2A. According to the present invention, both the lower and upper plate of the capacitor are above the circuit to be tuned.

Therefore, the apparatus disclosed in FIG. 3 allows a much higher capacitance variation than traditional approaches that apply DC bias to the RF substrate to create the electrostatic force. In fact, the absence of the circuit to be tuned between the plates 18 and 20 allows the distance between the plates 18 and 20 to be much greater than the distance between the plates of prior art arrangements.

It follows that a quite high change of Rf capacitance can be obtained also with a small spacing between the first layer and the second layer, because the change of capacitance depends on the distance between the second layer and third layer.

Placing the actuating circuitry above the circuit to be tuned allows a quite high change of capacitance, using a small spacing between the substrate and the membrane 17 (first and second layer) and a large spacing between the membrane 17 and the second wafer 19 (second and third layer). In fact, a large upper plate spacing gives increased travel and therefore high RF capacitance change. In this way, large resonator tunings can be created with a reasonable tuning voltage range while maintaining the Dc bias for the second-third layer capacitor and RF circuitry completely separate.

Figure 4:
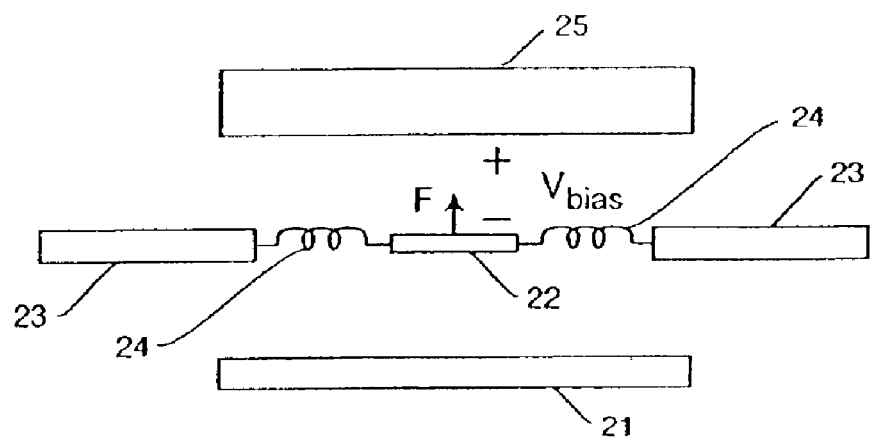
FIG. 4 shows the mathematical model corresponding to the arrangement of FIG. 3.

FIG. 4 shows a mathematical model corresponding to the arrangement of FIG. 3. The first layer containing the RF circuitry (for example a phase shifter) is indicated with 21. The membrane is indicated with 22. The membrane 22 can be imagined to be connected to supports 23 through springs 24, similarly to what shown in FIG. 2A.

Differently from the prior art, a third layer 25 is now placed over the membrane 22. The actuating DC voltage $V_{bias}$ is applied to the upper capacitor formed between the membrane 22 and the third layer 25. As soon as the voltage $V_{bias}$ is applied, an electrostatic force F is created in the upward direction. In this way, the membrane 22 is forced upward, thus changing the proximity of the membrane 22 to the lower substrate 21 that contains the RF circuitry. The change in proximity changes the RF capacitance in the RF circuitry of layer 21.

Applications are known that subject the device to high accelerations (high values of shock, mechanical vibration, etc). These accelerations, when combined with the present invention, could cause membrane movement, and therefore capacitance variation. The result would be an increase in RF noise due to mechanical vibrations (this is commonly termed "microphonics").

One way of overcoming this problem is to use a feedback control system to control the membrane position. With this scheme, the membrane capacitance is sensed (using additional circuitry) and the value is fed to the membrane position controller. If an external force attempts to change the membrane position, the change in capacitance is detected, and the position is corrected by the feedback control system. Since the position is maintained by applying attractive electrostatic forces (these forces are always attractive), it may be sometimes necessary to apply an attractive force in both directions (up and down) in order to control the membrane position.

Figure 5:
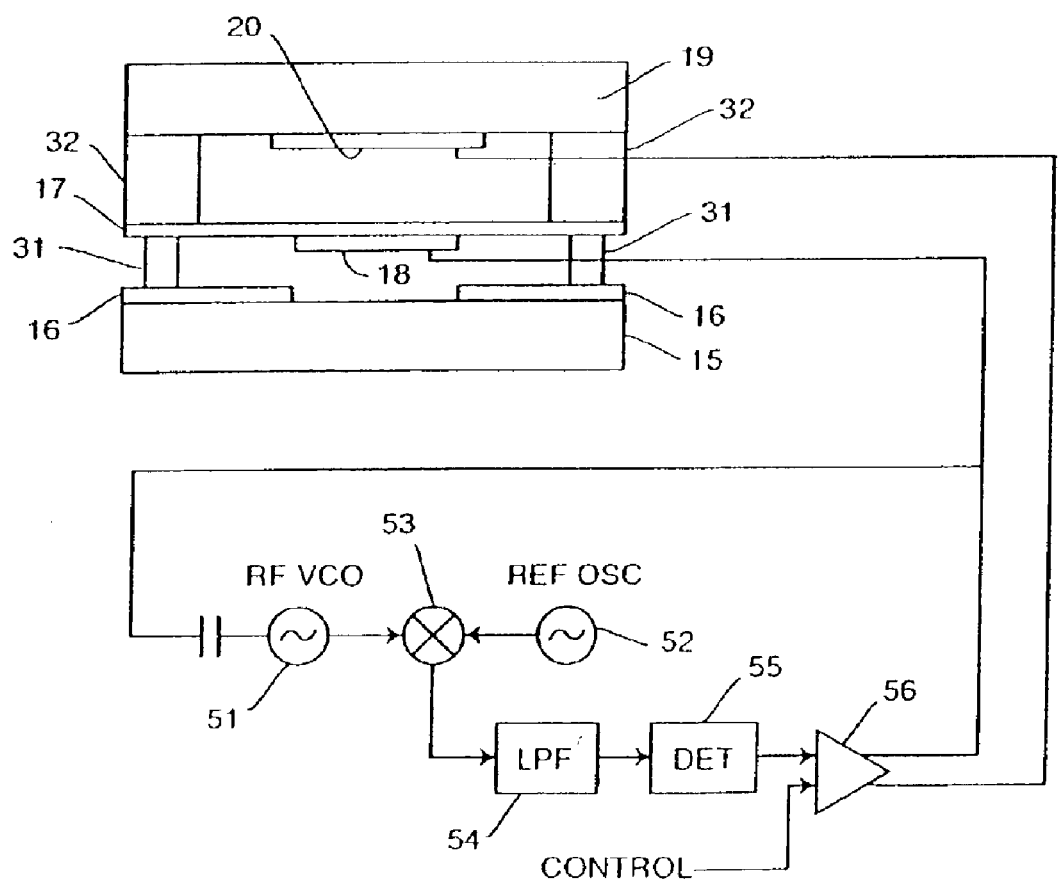
FIG. 5 shows the embodiment of FIG. 3 connected to a membrane position control circuit.

FIG. 5 shows an embodiment where the position of the membrane is controlled by means of the above described feedback control system. More specifically, FIG. 5 shows a side view of the apparatus shown in FIG. 3. The electric signal representing the membrane capacitance taken from the conductive elements 18 and 20 is used to control the frequency of a high frequency voltage controlled oscillator (VCO) 51. The frequency of the oscillator 51 is compared to the frequency of a stable reference oscillator 52. The comparison is made using a mixer 53. The output of the mixer 53 is filtered by means of a low-pass filter (LPF) 54. The LPF 54 is designed so that the frequency of the mixer output falls outside the passband edge of the lowpass filter during normal operation. Thus, if the output frequency of the VCO 51 is too high, the output voltage amplitude of the LPF 54 will be low. The output of the detecting device 55 has a signal strength which is proportional to the mixer output amplitude. The detecting device 55 output signal strength is compared to a control voltage level differential amplifier 56, whose output adjusts the membrane bias. In this way, membrane movement creates changes in membrane capacitance, which in turn creates a shift in the VCO frequency. This shift produces an error voltage at the mixer output which is fed back to the membrane bias. Thus, varying the control voltage varies the nominal plate spacing of the membrane capacitor.

A second way of overcoming the mechanical vibration problem of the membrane is that of forcing the membrane in both directions. More specifically, a bias voltage can be applied both to the top layer and to the bottom layer. This is important in applications where the membrane position is sensed and this information is fed back to the bias circuitry. In this manner the membrane position can be accurately held by a closed loop servo mechanism.

Figure 6:
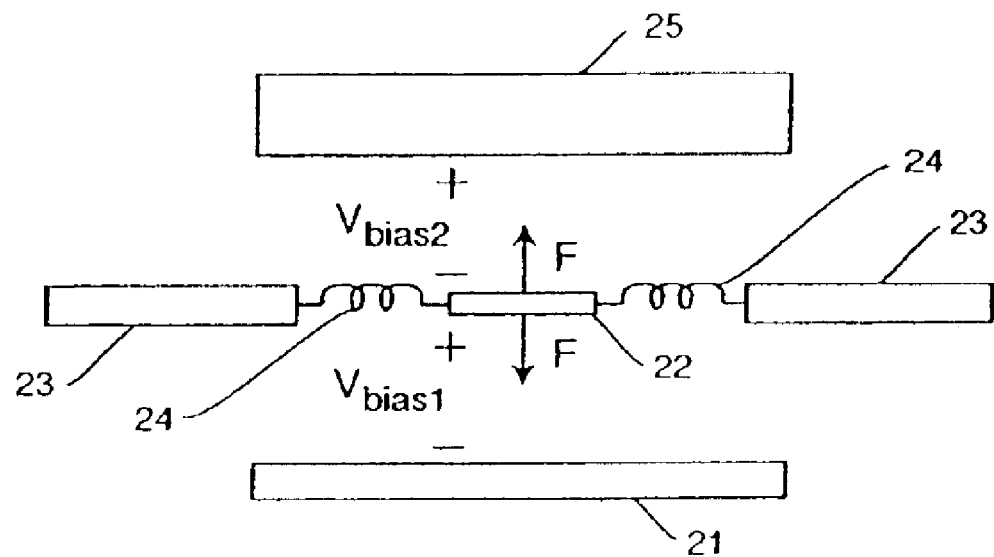
FIG. 6 shows a mathematical model of the present invention with a double bias arrangement.

FIG. 6 shows a mathematical model of such an arrangement, where a first bias voltage $V_{bias1}$ (first and second layer) and a second bias voltage $V_{bias2}$ (second and third layer) are applied.

Figure 7:
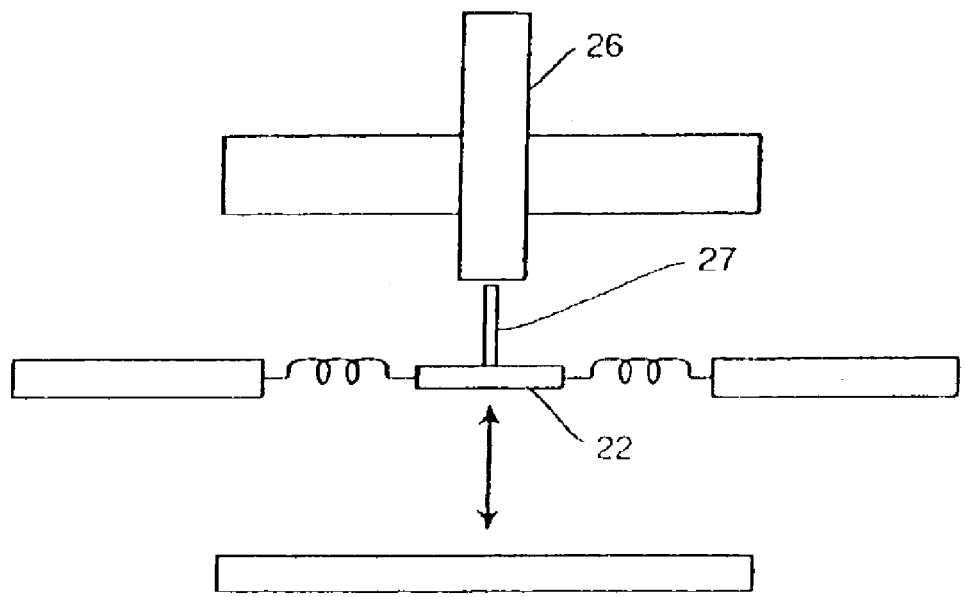
FIG. 7 shows a further embodiment of the present invention, in which the membrane is mechanically adjusted.

FIG. 7 shows a further alternative embodiment of the present invention, in which the movement of the membrane 22 is mechanically adjusted by means of a micrometer 26 comprising a micrometer rod 27 connected to the membrane 22. In this embodiment the membrane can be forced in both directions. Moreover, only two substrates are needed. Therefore, the distance between the membrane 22 and the electronic circuit to be tuned can either be greater or shorter than the distance between the membrane 22 and the electronic circuit to be tuned during the static condition of the membrane 22.

Figure 8:
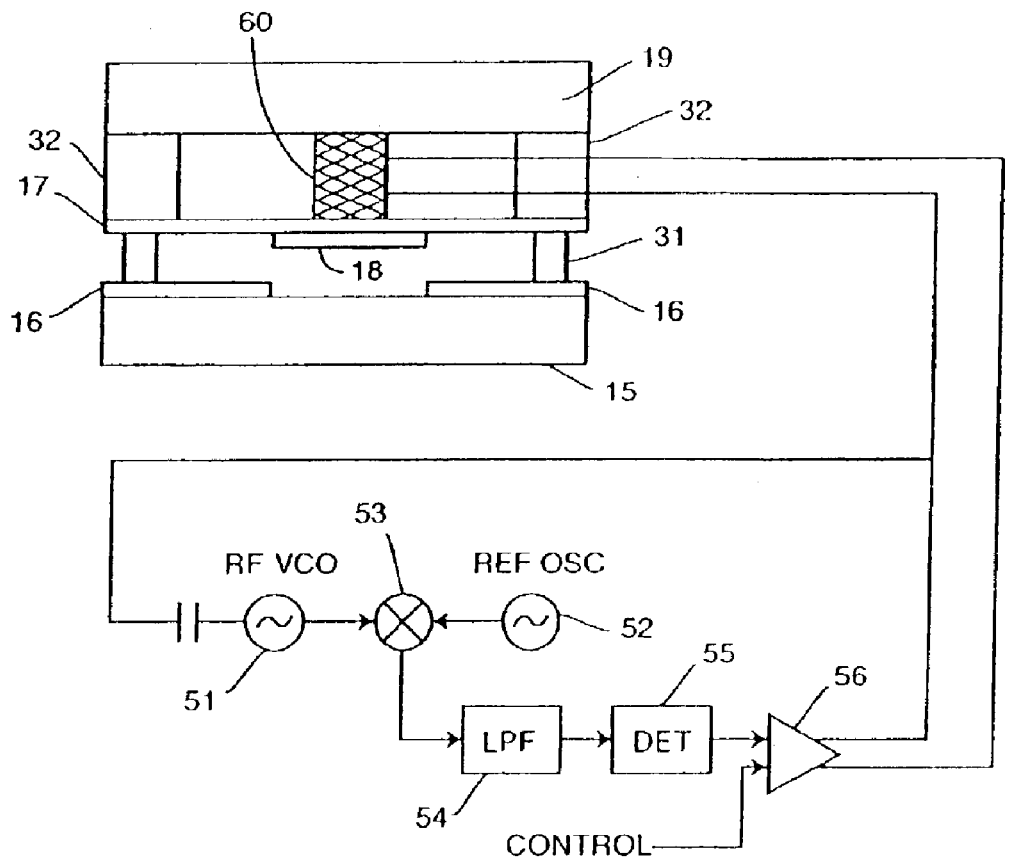
FIG. 8 shows an embodiment of the present invention where movement of the membrane is obtained by magnetic actuation.

A still further embodiment of the present invention is shown in FIG. 8. The embodiment of FIG. 8 is similar to the embodiment of FIG. 5. The major difference is the presence of a magnetic element, for example a voice coil 60 attached to the membrane 17, which allows movement of the membrane 17 by magnetic actuation and not by electrostatic force or mechanical actuation, as shown in the previous embodiments. Membrane movement is accomplished by running a current through the coil. Therefore, upon application of a bias voltage to the magnetic element or coil 60, a magnetic force is produced, causing the membrane to deform, thereby varying the distance of the membrane from the circuit and tuning the circuit. Preferably, the membrane can be moved either upwards only or both upwards and downwards.

In all embodiments (electrostatic, magnetic and mechanical), the movement of the metallized membrane above the RF circuit board changes the electrical properties on the RF board, namely the capacitance. Whether the membrane movement is accomplished by direct contact, magnetically or electrostatically, the result is a varying capacitance.

Figure 9:
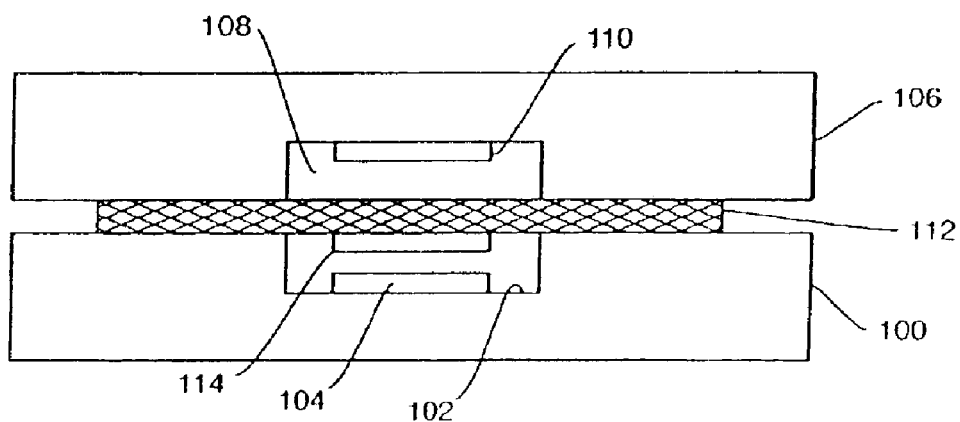
FIG. 9 shows a further embodiment of the present invention, where the need for precision spacers is eliminated.

A still further embodiment of the present invention eliminates the need for precision spacers as shown in FIG. 9. In this embodiment, a first substrate or wafer 100 is selectively etched down a controlled distance (e.g. 40 microns) in an area near the center of the substrate creating a first cavity 102 large enough to accommodate the circuit to be tuned, for example a microwave circuit, and the first pattern of conductive material 104. A second wafer 106 is also selectively etched down a controlled distance (e.g. 40 microns), creating a second cavity 108. The second cavity 108 contains a second pattern 110 of conductive material. The membrane 112 is located between the first wafer 100, and the second wafer 106. Further, a third pattern of conductive material 114 contacts the membrane 112.

The operation of the embodiment of FIG. 9 is similar to that of FIG. 3, where the circuit is tuned by adjusting the bias voltage between the conductive materials 110 and 114 forming respective upper and lower plates of a capacitor. Also in this case, an additional downward movement of the membrane can also be obtained, by adjusting the bias voltage between the conductive materials 114 and 104.

The VCMA actuator according to the present invention can be fabricated using photolithographic and wet etch techniques, i.e. wafer level packaging techniques. The layers shown in FIG. 3 can, for example, be made from photo-etchable glass, such as Foturan™ (by Mikroglas) or from silicon.

Herebelow, the process used for silicon will be described. The Foturan™ process is similar.

FIGS. 10–19 show a process for fabricating a membrane for use with the present invention. Note that the membrane shown in the previous Figures may be fabricated by processes other than those depicted in the following figures. Further, while the following figures depict multiple separate fabrication steps, alternative fabrication processes may allow several separate steps to be combined into fewer steps. Finally, alternative fabrication processes may use a different sequence of steps.

Figure 10:
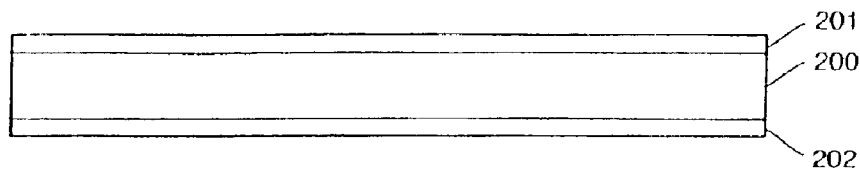
FIGS. 10–19 show steps of a method of fabricating a membrane for use with the present invention.

FIG. 10 shows a first step, where a substrate or silicon wafer 200 is provided. Protective layers 201, 202, made, for example, of SiN, are disposed on both sides of the wafer 200.

Figure 11:
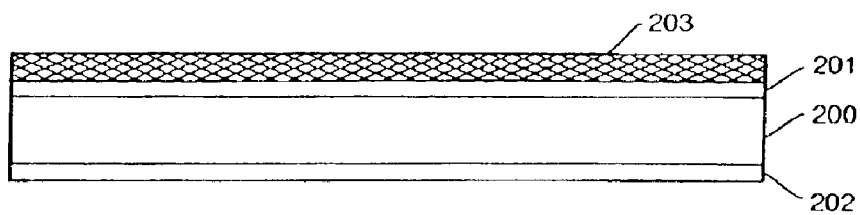

FIG. 11 shows a second step, where a metal film layer 203, for example a Ti—Au layer, is deposited over the protective layer 201. The thickness of layer 203 is preferably about 0.5 μm.

Figure 12:
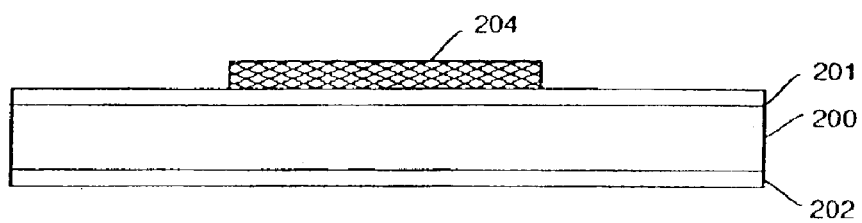

FIG. 12 shows a third step of the method, where the metal layer 203 is patterned to form a pad 204. The dimensions of the metal pad 204 are preferably chosen to be slightly smaller (for example about 100 μm) than the final membrane dimensions. This ensures that the metal layer 204 protects most of the exposed membrane in the step shown in FIG. 17, while enabling the final removal of the pad 204, in the step shown in FIG. 18.

Figure 13:
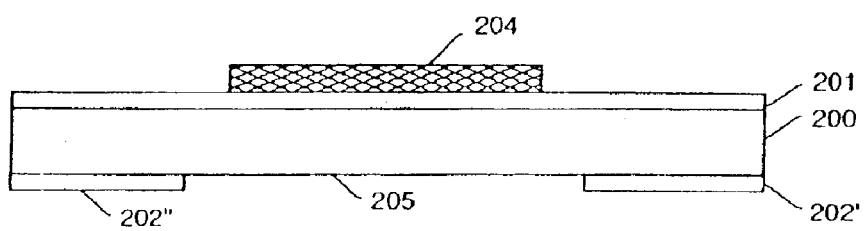

FIG. 13 shows a fourth step, where the protective layer 202 on the wafer backside is patterned to form a mask for the silicon etch, thus forming a window 205 between regions 202' and 202". The window 205 is aligned to the metal pads on the front side using an infrared mask aligner.

Figure 14:
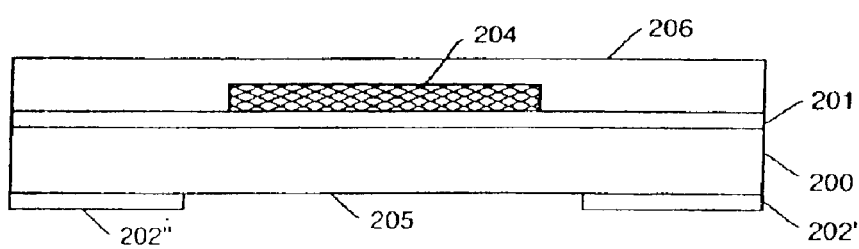

FIG. 14 shows a fifth step, where polymide is spinned on the wafer to obtain a polymide film 206. If necessary, the polymide is spinned with an adhesion promoter. The spinning speed can be, for example, in the range between 1500 and 5000 rpm. The thickness of the polymide film 206 can range, for example, between 5 and 15 μm.

In a sixth step of the method, the polymide is cured at an elevated temperature, preferably between 200° C. and 450° C., and more preferably about 350° C.

Figure 15:
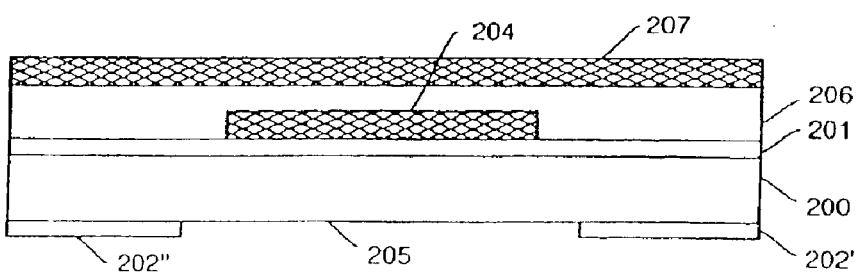

FIG. 15 shows a seventh step of the method, where a metal film layer 207 is deposited on the cured polymide 206. The layer 207 is usually a Ti—Au layer, having a preferred thickness of about 1 μm. The layer 207 will eventually be patterned into an electrode, as later shown in FIGS. 18 and 19.

Figure 16:
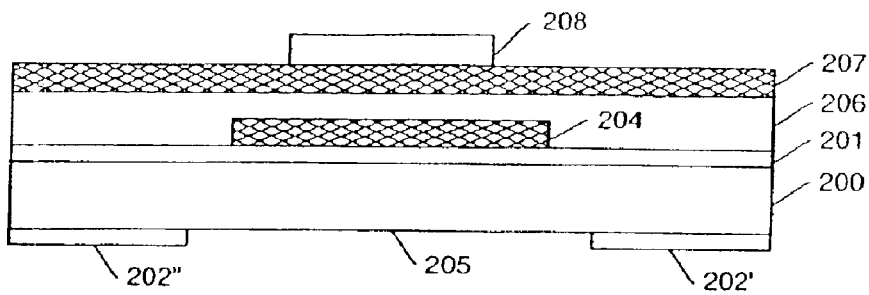

FIG. 16 shows an eighth step of the method, where a photoresist layer is spinned, patterned to a pad 208 and hard baked on the metal layer 207 to act as a protective layer against the metal etchants.

Figure 17:
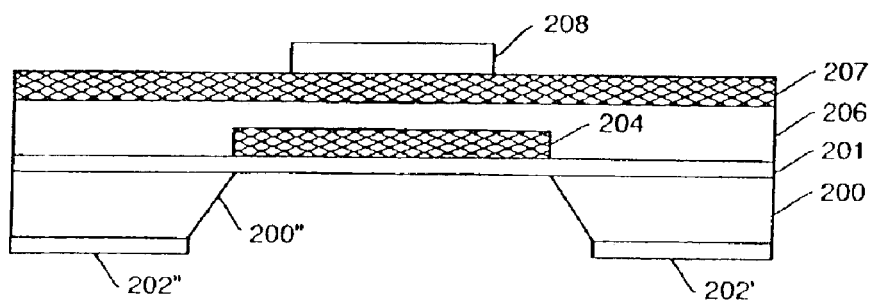

FIG. 17 shows a ninth step of the method, where the silicon layer 205 is etched from the backside, for example by mounting the wafer in a customized wafer holder and immersing in KOH solution at 100° C.

Figure 18:
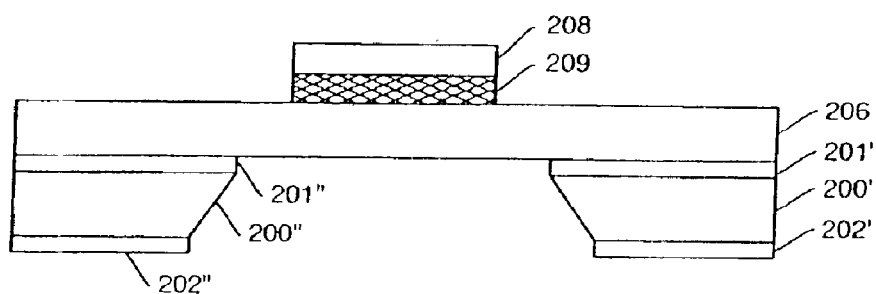

FIG. 18 shows a tenth step of the method, where the protective layer 201 and the Ti—Au layer 207 are etched away, for example by successively immersing the wafer in buffered oxide etchant (BOE) and Au etchant. In this way, the metal pad 204 is removed and a Ti—Au electrode 209 is patterned on the membrane 206.

Figure 19:
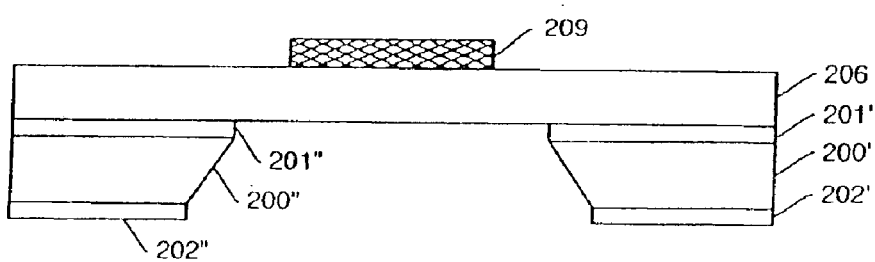

FIG. 19 shows a tenth step of the method, where the residual photoresist 208 is removed by spraying with acetone and spin drying.

In this way a polymide membrane together with an electrode is fabricated. The SiN layer 201 serves as an etch stop layer when etching the Si wafer, typically with KOH etchant. The SiN layer 202 is used to form etch windows in order to etch the silicon. Other materials can be used instead of the SiN. One possibility is to use Ethylene Diamine Pyrocatechol (EDP) etchant together with $SiO_2$. However, the use of SiN/KOH combination is preferable, because it is more effective than $SiO_2$/EPD when etching silicon wafers with high resistivity. Additionally, the etch by-products when using EDP tend to get deposited on the rest of the sample, thus burdening the cleaning process.

The step of depositing the SiN layers can be performed using PECVD (Plasma Enhanced Chemical Vapor Deposition) or LPCVD (Low Pressure Chemical Vapor Deposition) techniques.

While several illustrative embodiments of the invention have been shown and described, numerous variations and alternative embodiments will occur to those skilled in the art. Such variations and alternative embodiments are contemplated, and can be made without departing from the scope of the invention as defined in the appended claims.

What is claimed is:

1. A device for tuning an electronic circuit, comprising:
   a moveable membrane, wherein changes in distance between the membrane and the electronic circuit produce changes in capacitance of the electronic circuit; and
   a first capacitive arrangement operatively associated with the membrane, comprising a first capacitor plate and a second capacitor plate, wherein the first capacitor plate is located at a first distance from the electronic circuit and connected with the membrane, and the second capacitor plate is located at a second distance from the electronic circuit, the second distance being greater than the first distance.

2. The device of claim 1, wherein the membrane has a non-actuated condition and an actuated condition, and wherein tuning of the electronic circuit occurs during the actuated condition of the membrane.

3. The device of claim 2, wherein the distance between the membrane and the electronic circuit during the actuated condition of the membrane is greater than the distance between the membrane and the electronic circuit during the non-actuated condition of the membrane.

4. The device of claim 2, further comprising a second capacitive arrangement having a third capacitor plate and a fourth capacitor plate.

5. The device of claim 4, wherein a distance between the membrane and the electronic circuit during the actuated condition of the membrane can either be greater or shorter than a distance between the membrane and the electronic circuit during the non-actuated condition of the membrane.

6. The device of claim 4, wherein the third capacitor plate is the first capacitor plate and the fourth capacitor plate comprises the electronic circuit.

7. The device of claim 1, wherein the device is fabricated using a wafer-level packaging technique.

8. A membrane actuator for tuning an electronic circuit, comprising:
   a first substrate;
   a first conductive material disposed on the first substrate and containing the electronic circuit, the first substrate and the first conductive material forming a first layer;
   a flexible membrane;
   a second conductive material contacting the flexible membrane, the flexible membrane and the second conductive material forming a second layer, the flexible membrane and second conductive material being disposed above the first substrate and first pattern;
   a second substrate;
   a third conductive material contacting the second substrate, the second substrate and third conductive material forming a third layer, wherein:
   a parallel plate capacitor having an upper plate and a lower plate is formed between the second layer and the third layer, the second conductive material forming the upper plate of the capacitor and the third conductive material forming the lower plate of the capacitor, and
   when a bias voltage is applied between the upper plate and the lower plate, an electrostatic force is produced, causing the membrane to deform, thereby varying the capacitance of the electronic circuit.

9. The membrane actuator of claim 8, wherein a distance between the membrane and the electronic circuit upon application of the bias voltage is greater than a distance between the membrane and the electronic circuit in absence of application of the bias voltage.

10. The membrane actuator of claim 8, wherein a distance between the membrane and the electronic circuit upon application of the bias voltage can either be greater or shorter than a distance between the membrane and the electronic circuit in absence of application of the bias voltage.

11. The membrane actuator of claim 8, wherein the first substrate is a micromachined wafer.

12. The membrane actuator of claim 8, further comprising polymide spacers for separating the first layer from the second layer.

13. The membrane actuator of claim 8, further comprising polymide spacers for separating the first layer from the second layer and the second layer from the third layer.

14. The membrane actuator of claim 8, further comprising a feedback control system to control the membrane position.

15. The membrane actuator of claim 14, wherein the feedback control system comprises:
   a voltage controlled oscillator having a voltage controlled oscillator frequency, the voltage controlled oscillator frequency being associated with the capacitance of the capacitor;
   a reference oscillator having a reference oscillator frequency;
   a mixer for comparing the voltage controlled oscillator frequency with the reference oscillator frequency, the mixer having a first mixer input connected to the voltage controlled oscillator, a second mixer input connected to the reference oscillator, and a mixer output, the mixer output having a mixer output amplitude and a mixer output frequency;
   a low-pass filter, having a low-pass filter input connected to the mixer output, and a low-pass filter output;
   a detecting device having a detecting device input connected to the low-pass filter output and having a detecting device output; and
   a differential amplifier having a first differential amplifier input connected to the detecting device output, a second differential amplifier input connected to a control signal, and a differential amplifier output, the differential amplifier output being connected to the upper and lower plate of the capacitor.

16. The membrane actuator of claim 15, wherein the low-pass filter is designed so that the mixer output frequency falls outside a passband edge of the lowpass filter during normal operation.

17. The membrane actuator of claim 15, wherein the detecting device output has an output signal strength inversely proportional to the mixer output amplitude.

18. The membrane actuator of claim 15, wherein the control signal is adjustable.

* * * * *